United States Patent
Ibrahim et al.

(10) Patent No.: US 7,345,490 B2
(45) Date of Patent: Mar. 18, 2008

(54) FILTER CALIBRATION

(75) Inventors: Brima B. Ibrahim, Aliso Viejo, CA (US); Hea Joung Kim, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 137 days.

(21) Appl. No.: 11/120,608

(22) Filed: May 3, 2005

(65) Prior Publication Data

US 2005/0189951 A1    Sep. 1, 2005

Related U.S. Application Data

(63) Continuation of application No. 10/645,130, filed on Aug. 21, 2003, now Pat. No. 6,914,437.

(51) Int. Cl.
  G01R 27/28    (2006.01)
  H04B 15/00    (2006.01)

(52) U.S. Cl. .................................. 324/616; 702/190

(58) Field of Classification Search ............... 324/616, 324/615, 612, 600, 601, 130, 202, 74, 76.11, 324/76.29, 76.44, 76.68; 455/306, 340; 702/85, 702/106, 107, 190
See application file for complete search history.

(56) References Cited

U.S. PATENT DOCUMENTS

| | | | | |
|---|---|---|---|---|
| 4,858,159 | A * | 8/1989 | Wheelwright et al. ...... | 702/106 |
| 5,101,509 | A * | 3/1992 | Lai ........................... | 455/183.1 |
| 5,245,646 | A * | 9/1993 | Jackson et al. ................ | 377/2 |
| 5,280,638 | A * | 1/1994 | Porambo et al. ............ | 455/143 |
| 5,903,857 | A * | 5/1999 | Behrens et al. ............. | 702/190 |
| 5,914,633 | A * | 6/1999 | Comino et al. ............. | 327/553 |
| 6,003,051 | A * | 12/1999 | Okazaki ........................ | 708/3 |
| 6,014,554 | A * | 1/2000 | Smith .......................... | 455/340 |
| 6,018,702 | A * | 1/2000 | Luiz ............................ | 702/107 |
| 6,356,163 | B1 * | 3/2002 | Dunsmore et al. ......... | 333/17.1 |
| 6,441,983 | B1 * | 8/2002 | Philpott et al. ............... | 360/67 |
| 6,584,422 | B2 * | 6/2003 | Bhaumik et al. ........... | 702/107 |
| 6,731,145 | B1 * | 5/2004 | Humphreys et al. ........ | 327/156 |
| 6,885,181 | B1 * | 4/2005 | Roo ........................ | 324/76.28 |
| 6,909,292 | B1 * | 6/2005 | Kavadias ..................... | 324/601 |
| 6,914,437 | B2 * | 7/2005 | Ibrahim et al. ............. | 324/616 |
| 7,054,606 | B1 * | 5/2006 | Sheng et al. ................ | 455/306 |

* cited by examiner

Primary Examiner—Andrew H. Hirshfeld
Assistant Examiner—Hoai-An D. Nguyen
(74) Attorney, Agent, or Firm—Garlick, Harrison & Markison:; Jessica W. Smith

(57) ABSTRACT

A method for calibrating a filter begins with the filter filtering a first signal having a first frequency to produce a first filtered signal, wherein the first frequency is in a known pass region of the filter. The processing continues by measuring signal strength of the first filtered signal to produce a first measured signal strength. The processing continues with the filter filtering a second signal having a second frequency to produce a second filtered signal, wherein the second frequency is at a desired corner frequency of the filter. The processing continues by measuring signal strength of the second filtered signal to produce a second measured signal strength. The processing continues by comparing the first measured signal strength with the second measured signal strength to determine whether the filter has attenuated the second signal by a desired attenuation value with respect to the first signal. The processing continues by adjusting filter response of the filter to produce an adjusted filter response when the filter has not attenuated the second signal by the desired attenuation value with respect to the first signal.

18 Claims, 7 Drawing Sheets

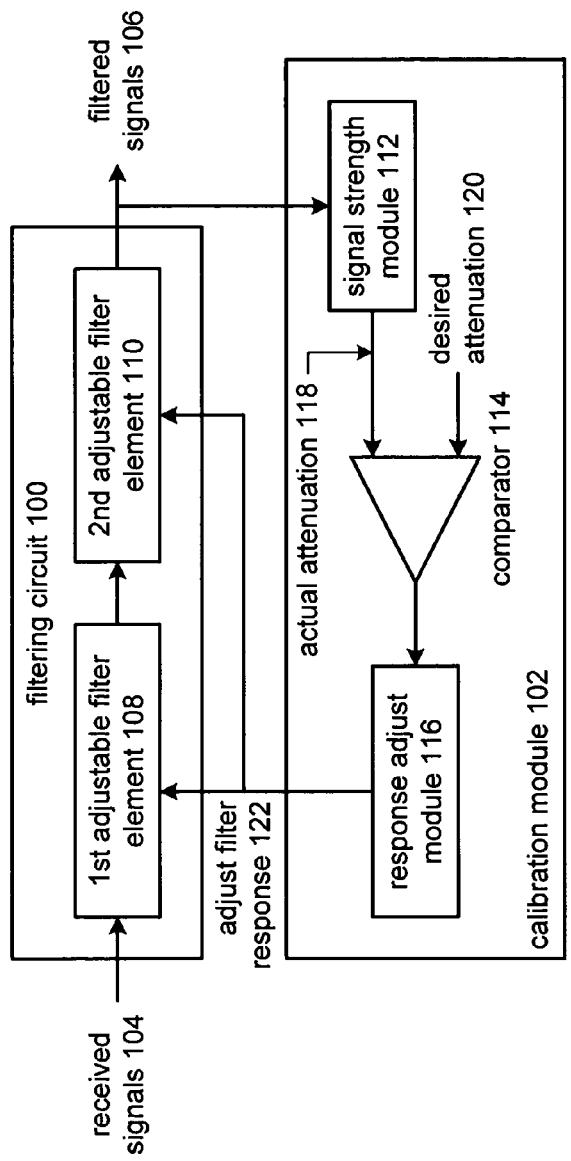
FIG. 3
filtering module 68 with calibration
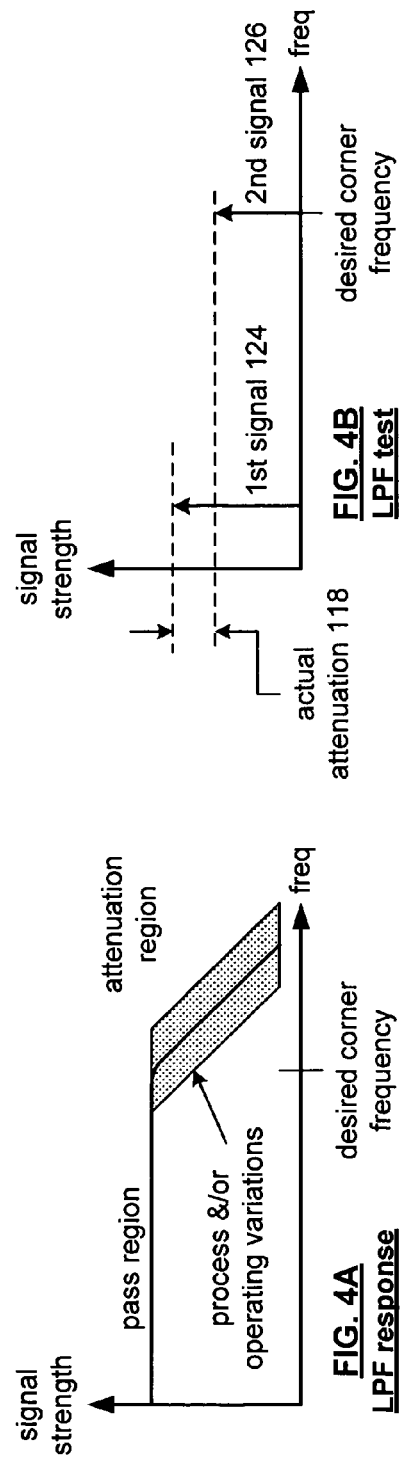
FIG. 4B
LPF test
FIG. 4A
LPF response

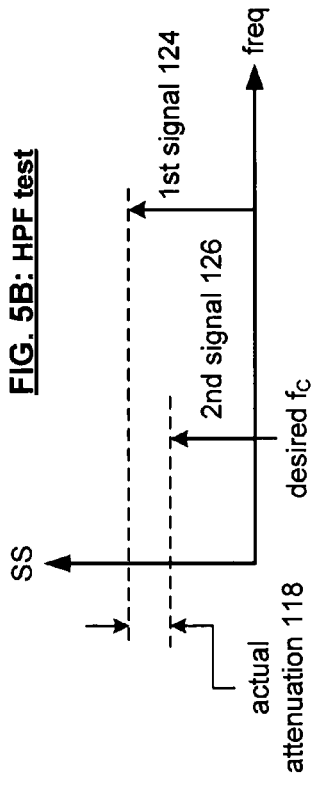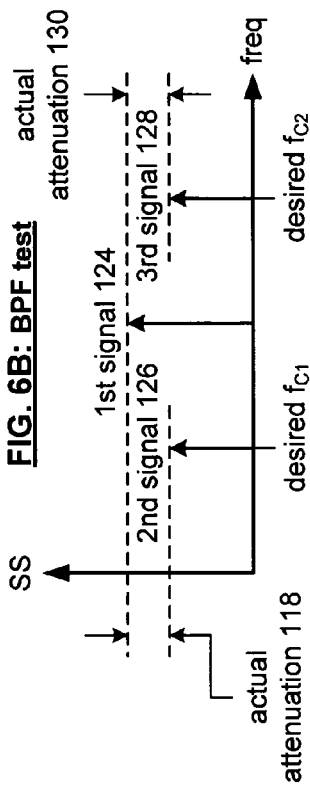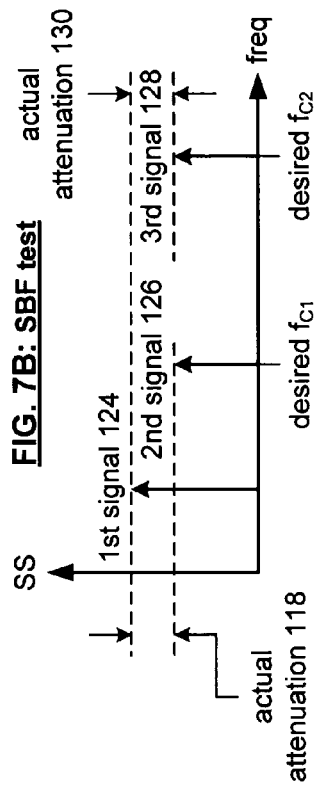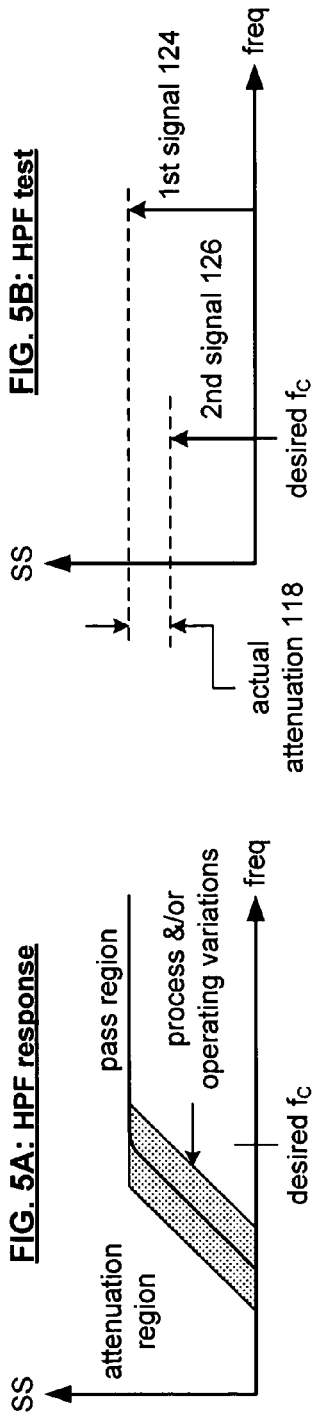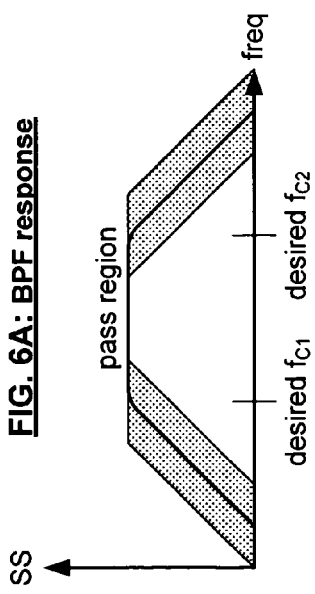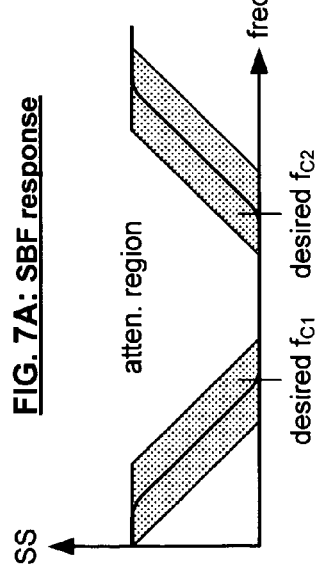

calibration configuration for radio 60

FILTER CALIBRATION

This patent application is claiming priority under 35 USC § 120 as a continuing patent application of patent application entitled Filter Calibration And Applications Thereof, having a filing date of Aug. 21, 2003, and a Ser. No. 10/645,130, which is now issued as U.S. Pat. No. 6,914,437.

BACKGROUND OF THE INVENTION

1. Technical Field of the Invention

This invention relates generally to integrated circuits and more particularly to calibration of circuits of the integrated circuit.

2. Description of Related Art

Integrated circuits are known to be used in a wide variety of electronic equipment including radios, cellular telephones, wireless modems, home appliances, etc. One common technology for producing integrated circuits is Complimentary Metal Oxide Semiconductor, which is more commonly known as CMOS. CMOS technology has become the fabrication technology of choice for a majority of commercial grade integrated circuits due to its flexibility of design, level of integration, and cost.

While CMOS technology offers many advantages, there are some limitations. For instance, component tolerances of on-chip resistors, capacitors, and/or transistors are at best +/−5%, but more typically +/−20%. For many circuits, the component tolerance is not a critical issue, however, for precision circuit the component tolerance is a critical issue. For example, a resistor-capacitor (e.g., RC) low pass filter passes signals having frequencies below a corner frequency of the low pass filter and attenuates signals having frequencies above the corner frequency. As is known, the corner frequency is established based on the resistance value and capacitance value. With component tolerances of +/−20%, the corner frequency of a single pole RC low pass filter (i.e., a low pass filter that includes a single resistor and a single capacitor) may vary from 0.64 of the desired corner frequency when the R and C are each at the minimum component value to 1.44 of the desired corner frequency when the R and C are each at the maximum component value. This wide variation is unacceptable.

To reduce the adverse affects of the component tolerance variation, many CMOS integrated circuit (IC) designs include an RC calibration circuit and selectable resistor circuits and capacitor circuits for use in precision circuits. In general, the RC calibration circuit includes a test resistor and a test capacitor. The test resistor and test capacitor are tested, typically by applying a voltage, a pulse, and/or a ramp, to determine their actual values. The actual values are compared to the designed values to determine a difference. The difference is used to tune the selectable resistor circuits and capacitor circuits. For example, if the test resistor was designed to be a 1 Kilo-Ohm resistor and it is measured to be 900 Ohms, the actual value is 90% of the desired value. To achieve the desired value, the actual value must be increased by 1.11 (e.g., 1/0.9). Thus, the selectable resistor and capacitor circuits are adjusted by a value of 1.11.

While the RC calibration circuits allow for precision circuits to be implemented on ICs using CMOS technology, they are based on the assumption that the components of the IC have the same component offset as the test components. In many applications, this assumption is of no consequence. For highly precise circuits, such as low pass filters used in radio receivers to block local oscillation leakage, the RC calibration circuit is not sufficiently accurate.

Therefore, a need exists for a method and apparatus to calibrate highly precise IC circuits including filters.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 3 is a schematic block diagram of a filtering module with calibration in accordance with the present invention;

FIG. 4A is a graph of a filter response of a low pass filter;

FIG. 4B is a graph of testing a low pass filter in accordance with the present invention;

FIG. 5A is a graph of a filter response of a high pass filter;

FIG. 5B is a graph of testing a high pass filter in accordance with the present invention;

FIG. 6A is a graph of a filter response of a bandpass filter;

FIG. 6B is a graph of testing a bandpass filter in accordance with the present invention;

FIG. 7A is a graph of a filter response of a stop band pass filter;

FIG. 7B is a graph of testing a stop band pass filter in accordance with the present invention;

DETAILED DESCRIPTION OF THE INVENTION

Figure 1:
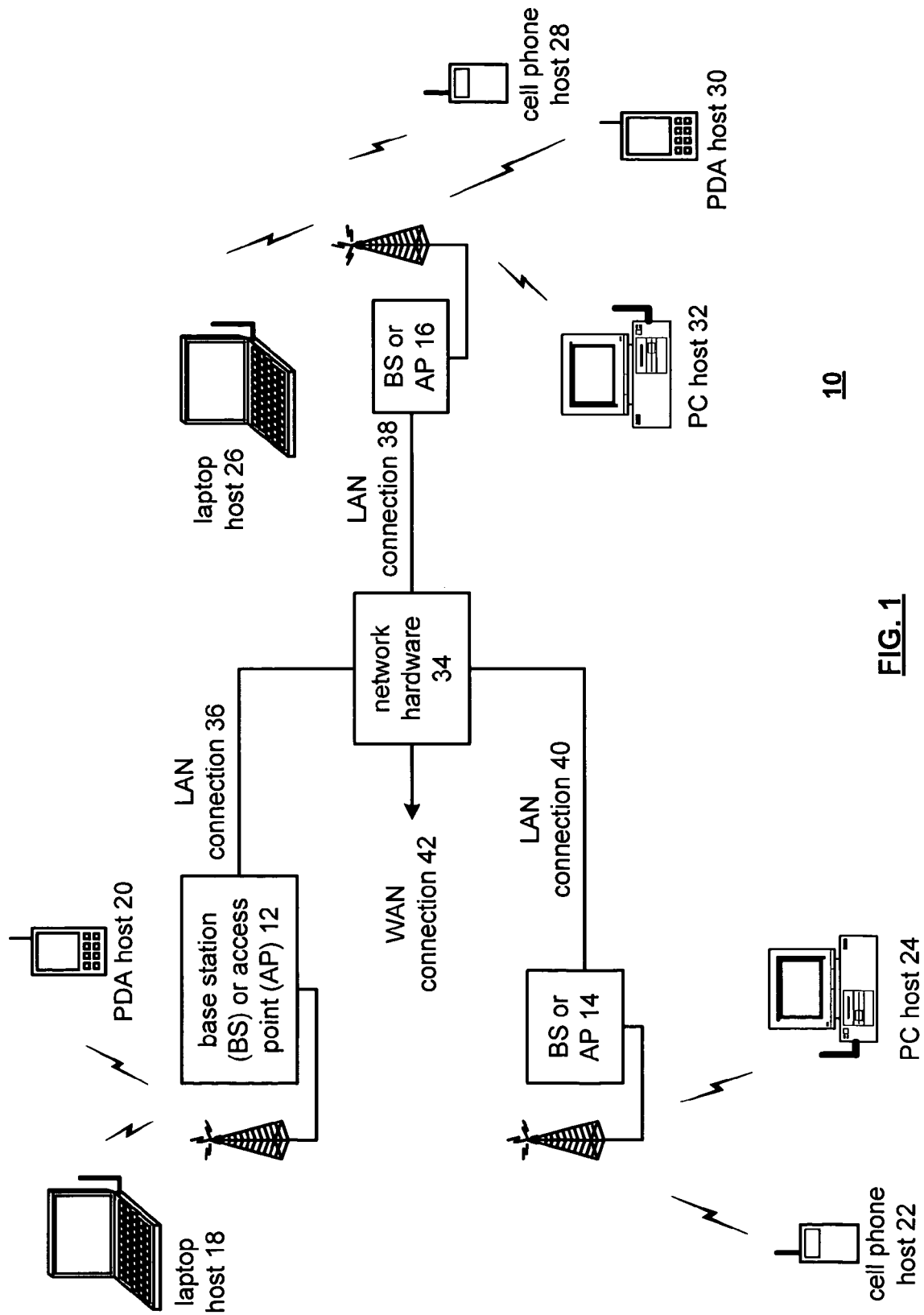
FIG. 1 is a schematic block diagram of a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
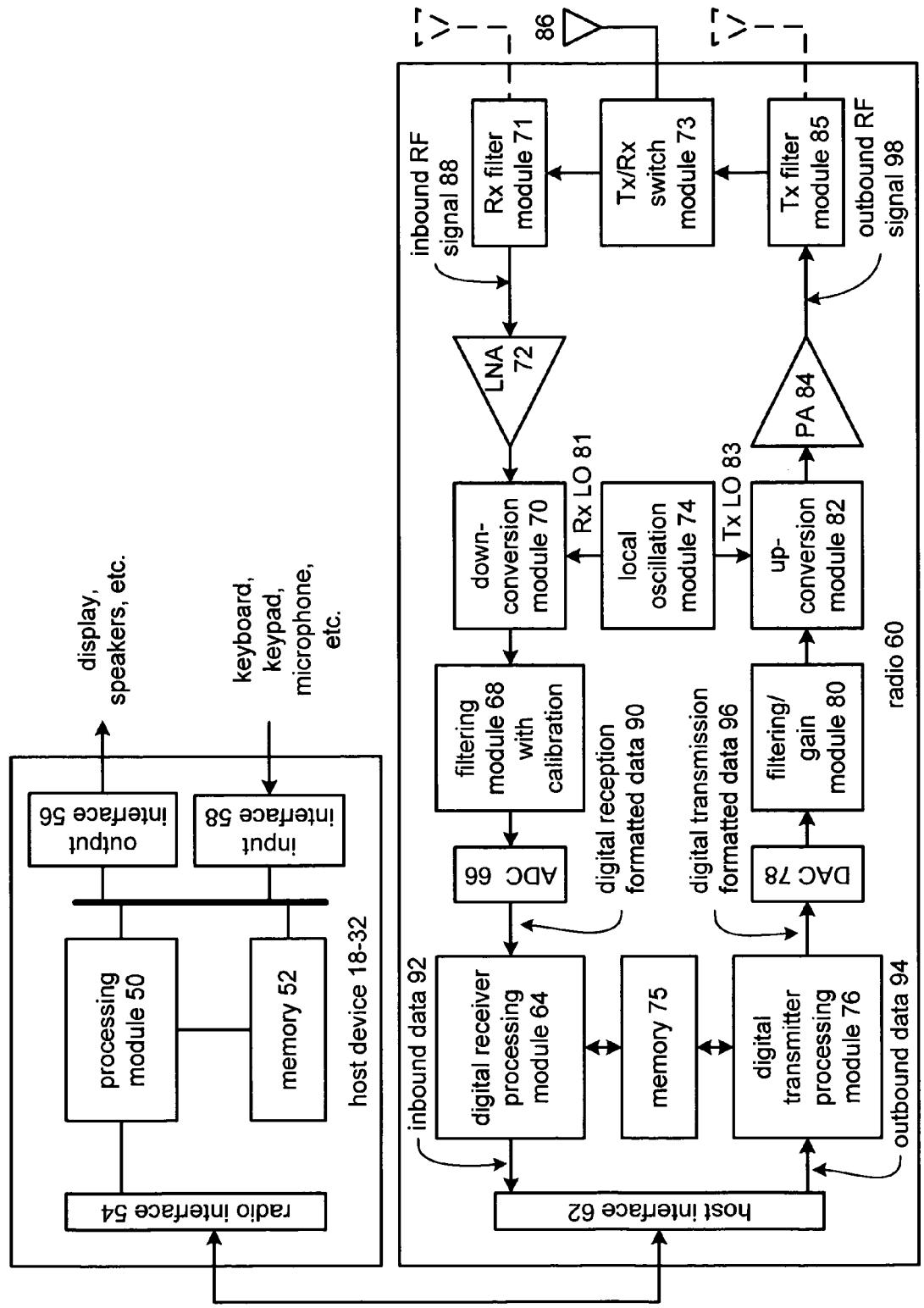
FIG. 2 is a schematic block diagram of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant. The filtering/gain modules 68 and/or 80 may include calibration circuitry as will be described with reference to FIGS. 3-10.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

FIG. 3 is a schematic block diagram of a filtering module 68 and/or 80 that includes a filtering circuit 100 and a calibration module 102. The filtering circuit 100, which may be a low pass filter, a bandpass filter, a stop band filter, or a high pass filter, includes a first adjustable filter element 108 and a second adjustable filter element 110. The particular types of components of the first and second adjustable filter elements 108 and 110 depend on the type of filtering desired. For example, for a low pass filter, the first adjustable filter element 108 may be an adjustable resistor and the second adjustable filter element 110 may be an adjustable capacitor.

The calibration module 102 includes a signal strength module 112, a comparator 114, and a response adjust module 116. In operation, a tone signal (i.e., a signal having a single frequency component) having a frequency well within the pass region of the filtering circuit 100 is provided to the input of the filtering circuit 100 as a received signal 104. Since this tone signal is well within the pass region of the filter, the filtered output signal 106 should substantially match the inputted tone signal. The signal strength module 112, which may be a received signal strength indicator, measures the signal strength of the filtered signal 106 of the first tone signal. This signal strength value is stored within the signal strength module 112. Next, a second tone signal is inputted to the filtering circuit 100, where second tone signal has a frequency at a corner frequency of the filtering circuit 100.

For example, if the filtering circuit 100 implements a single pole low pass filter, the corner frequency corresponds to the −3 dB point (i.e., the frequency at which a signal is attenuated by approximately $\frac{1}{3}^{rd}$ by the filter with respect to an unattenuated signal) as shown in FIG. 4. While the desired corner frequency establishes the pass region (i.e., signals having frequencies in this region are passed substantially unattenuated) and the attenuation region (i.e., signals having frequencies in this region are attenuated based on the response of the filter). Due to limitations of the CMOS technology, a low pass filter will most likely not have the desired corner frequency, but one that is up to forty percent from the desired corner frequency, as illustrated by the shaded area.

Continuing with the low pass filter example, and with reference to FIG. 5, the first filtered tone signal 124 has a frequency well within the pass region, thus its amplitude substantially matches the amplitude of the inputted tone signal. In one embodiment, to ensure that the first filtered tone signal 124 is within the pass region, the components of the filter are set to provide a maximum pass band. The second filtered tone signal 126 has a frequency at the desired corner frequency. The signal strength module 112 stores both signal strengths and compares them to establish an actual attenuation 118.

Returning to the discussion of FIG. 3, the comparator compares the actual attenuation 118 is compared with the desired attenuation 120, which for a low pas filter is −3 dB (i.e., the magnitude of the second filtered tone signal 126 should be approximately ⅔rds of the magnitude of the first filtered tone signal 124). If the actual attenuation 118 substantially matches the desired attenuation 120, the corner frequency of the low pass filter is at the desired frequency. If, however, the actual attenuation 118 is greater than the desired attenuation (i.e., the magnitude of the second filtered tone signal 126 is less than the desired ⅔rds the amplitude of the first filtered tone signal 124), the corner frequency is too low. In this instance, the response adjust module 116 generates an adjust filter response 122 that increases the value of the first and/or second adjustable filter element 108 and 110. Once the adjustment is made, the process is repeated until the actual attenuation 118 substantially matches the desired attenuation 120.

If the actual attenuation 118 is less than the desired attenuation 120 (i.e., the magnitude of the second filtered tone signal 126 is greater than the desired ⅔rds the amplitude of the first filtered tone signal 124), the corner frequency is too high. In this instance, the response adjust module 116 generates an adjust filter response 122 that decreases the value of the first and/or second adjustable filter element 108 and 110. Once the adjustment is made, the process is repeated until the actual attenuation 118 substantially matches the desired attenuation 120. As such, the value of one or both of the adjustable filter elements 108 and 110 may be incrementally adjusted to achieve the desired attenuation, i.e., the desired corner frequency. Alternatively, the response adjust module 116 may determine the amount of difference between the actual attenuation 118 and the desired attenuation 120. Based on the difference, the response adjust module 116 determines the adjust filter response 122.

The calibration filter of FIG. 3 may be a low pass filter, as described with reference to FIG. 4, a high pass filter, a bandpass filter, or a stop band filter. FIGS. 5A and 5B illustrate the calibration of a high pass filter. FIG. 5A illustrates the frequency response of a single pole, or first order, high pass filter that includes an attenuation region and a pass region. The desired corner frequency delineates these two regions. The calibration of the high pass filter is shown in FIG. 5B. The calibration begins by providing a first tone signal that has a frequency well within the pass region. The filtered first tone signal 124 is shown to have a first magnitude, or signal strength. The calibration continues by providing a second tone signal that has a frequency at the desired corner frequency of the high pass filter. The filtered second tone signal 126 is shown to have a second magnitude, or signal strength, that is less than that of the filtered first tone signal 124. The actual attenuation 118 is determined based on the difference signal strength of the first and second filtered tone signals 124 and 126, which is subsequently compared to the desired attenuation. Based on this comparison, the components of the high pass filter are adjusted to obtain the desired corner frequency.

FIGS. 6A and 6B illustrate the calibration of a bandpass filter. FIG. 6A illustrates the frequency response of a first order bandpass filter that includes two attenuation regions and a pass region. The desired corner frequencies delineate the pass region from the two attenuation regions. The calibration of the bandpass filter is shown in FIG. 6B. The calibration begins by providing a first tone signal that has a frequency well within the pass region. The filtered first tone signal 124 is shown to have a first magnitude, or signal strength. The calibration continues by providing a second tone signal that has a frequency at one of the desired corner frequencies of the bandpass filter. The filtered second tone signal 126 is shown to have a second magnitude, or signal strength, that is less than that of the filtered first tone signal 124. The actual attenuation 118 for this corner frequency is determined based on the difference signal strength of the first and second filtered tone signals 124 and 126, which is subsequently compared to the desired attenuation. Based on this comparison, the components of the bandpass filter are adjusted to obtain the desired corner frequency for this corner frequency. The calibration further includes providing a third tone signal that has a frequency at the other desired corner frequency of the bandpass filter. The filtered third tone signal 128 is shown to have a third magnitude, or signal strength, that is less than that of the filtered first tone signal 124. The actual attenuation 118 for this corner frequency is determined based on the difference signal strength of the first and third filtered tone signals 124 and 128, which is subsequently compared to the desired attenuation. Based on this comparison, the components of the bandpass filter are adjusted to obtain the desired corner frequency for this corner frequency.

FIGS. 7A and 7B illustrate the calibration of a stop band filter. FIG. 7A illustrates the frequency response of a first order stop band filter that includes two pass regions and an attenuation region. The desired corner frequencies delineate the attenuation region from the two pass regions. The calibration of the stop band filter is shown in FIG. 7B. The calibration begins by providing a first tone signal that has a frequency well within the first pass region or the second pass region. The filtered first tone signal 124 is shown to have a first magnitude, or signal strength. The calibration continues by providing a second tone signal that has a frequency at one of the desired corner frequencies of the stop band filter. The filtered second tone signal 126 is shown to have a second magnitude, or signal strength, that is less than that of the filtered first tone signal 124. The actual attenuation 118 for this corner frequency is determined based on the difference signal strength of the first and second filtered tone signals 124 and 126, which is subsequently compared to the desired attenuation. Based on this comparison, the components of the stop band filter are adjusted to obtain the desired corner frequency for this corner frequency. The calibration further includes providing a third tone signal that has a frequency at the other desired corner frequency of the stop band filter. The filtered third tone signal 128 is shown to have a third magnitude, or signal strength, that is less than that of the filtered first tone signal 124. The actual attenuation 118 for this corner frequency is determined based on the difference signal strength of the first and third filtered tone signals 124 and 128, which is subsequently compared to the desired attenuation. Based on this comparison, the components of the stop band filter are adjusted to obtain the desired corner frequency for this corner frequency.

Figure 8:
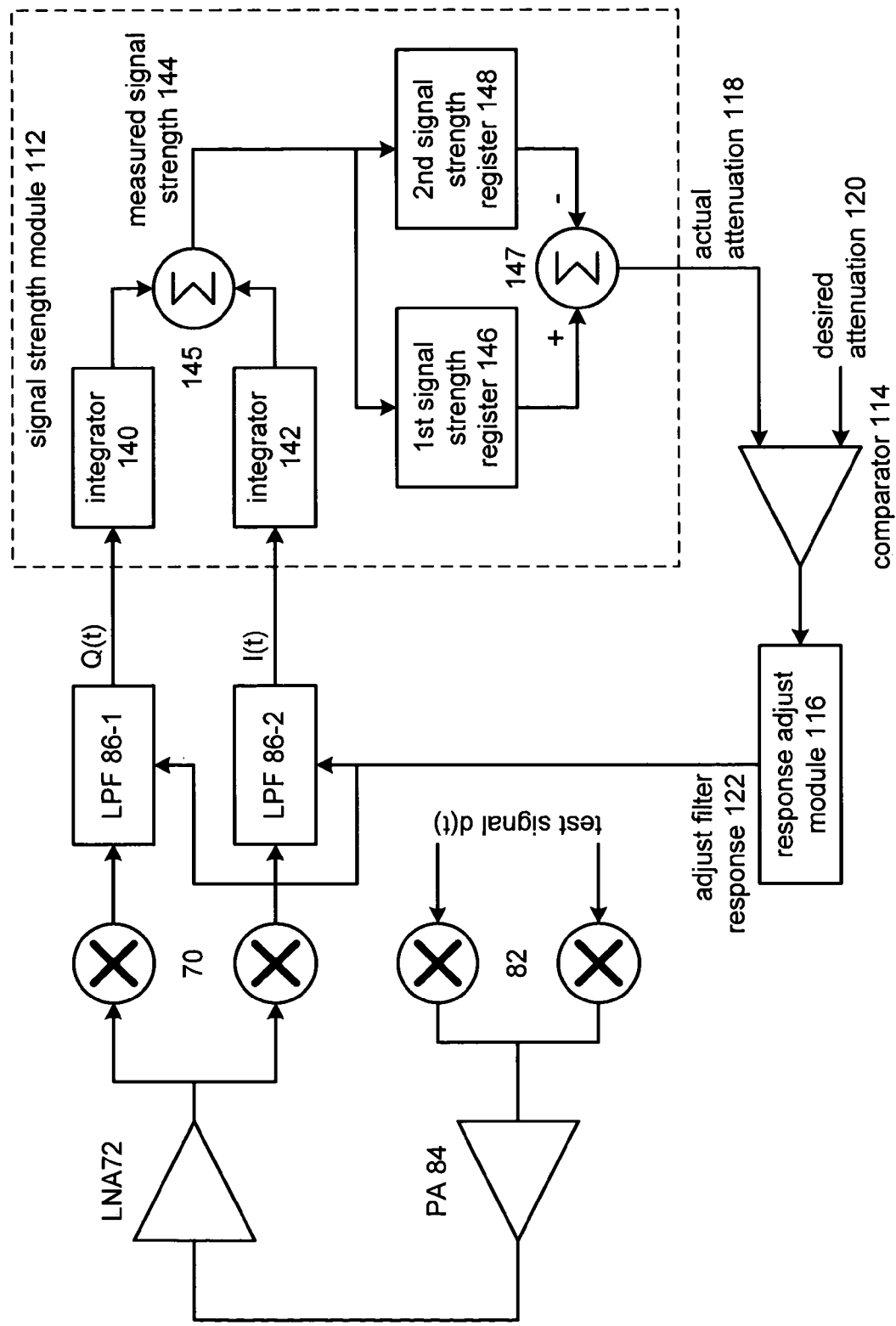
FIG. 8 is a schematic block diagram of a calibration configuration for a receiver section of a radio in accordance with the present invention.

FIG. 8 is a schematic block diagram of a calibration configuration for the low pass filters (LPF) 86 of a radio receiver. In this configuration, the output of a power amplifier 84 is coupled to the input of the low noise amplifier 72. Thus, test signals (i.e., the tone signals) may be inputted to the mixers of the up conversion module 82. The mixers mix the test signals with a local oscillation to produce RF signals. The RF signals are received by the low noise amplifier 72 and provided to the mixers of the down conversion module 70. The mixers of the down conversion module 70 mix the received RF signals with a local oscillation to produce base band, or low intermediate frequency, signals that include an in-phase component [I(t)] and a quadrature component [Q(t)]. The low pass filters 86-1 and 86-2 filter the in-phase component and the quadrature component, respectively.

In this embodiment, the signal strength module 112 includes two integrators 140 and 142, a summation module 145, two registers 146 and 148, and a subtraction module 147. The integrators 140 and 142 integrate the absolute values of the filtered I and Q components to obtain a corresponding energy of the two components. The summation module 145 adds the energy components together to obtain the measured signal strength 144. If the signal being processed corresponds to the first tone signal (i.e., the signal having a frequency well within the pass region of the filter), the measured signal strength 144 is stored in the first signal strength register 146. If, however, the signal corresponds to the second tone signal (i.e., the signal having a frequency at the desired corner frequency), the measured signal strength is stored in the second signal strength register 148. Once the signal strengths of the first and second tone signals have been stored, the subtraction module 147 subtracts the measured signal strength of the second tone signal from the measured signal strength of the first tone signal to produce the actual attenuation 118.

The comparator 114 compares the actual attenuation 118 with the desired attenuation 120 to produce an indication of the filter response. The response adjust module 116 interprets the output of the comparator 114 to generate the adjust filter response signal 122.

Figure 9:
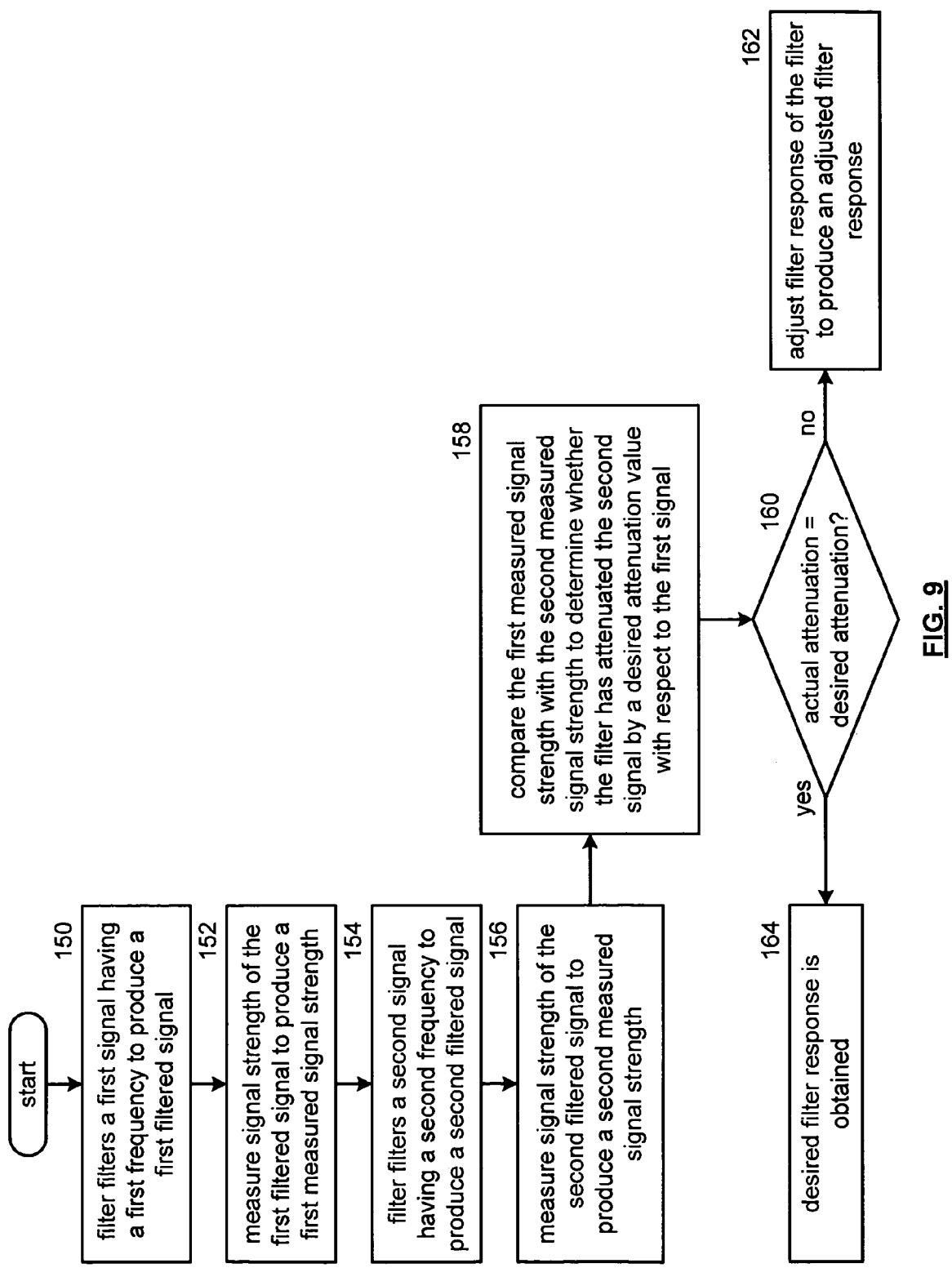
FIG. 9 is a logic diagram of a method for calibrating a filter in accordance with the present invention.

FIG. 9 is a logic diagram of a method for calibrating a filter that begins at step 150 where a filter filters a first signal having a first frequency to produce a first filtered signal, wherein the first frequency is in a known pass region of the filter. The filter may be of various embodiments including a low pass filter, a bandpass filter, a high pass filter, and/or stop band filter. The processing continues at step 152 where the signal strength of the first filtered signal is measured to produce a first measured signal strength. The processing continues at step 154 where the filter filters a second signal having a second frequency to produce a second filtered signal, wherein the second frequency is at a desired corner frequency of the filter. The processing continues at step 156 where the signal strength of the second filtered signal is measured to produce a second measured signal strength.

The processing continues at step 158 where the first measured signal strength is compared with the second measured signal strength to determine whether the filter has attenuated the second signal by a desired attenuation value with respect to the first signal. If yes, the process proceeds to step 164 where the desired filter response is obtained. If not, the process proceeds to step 162 wherein the filter response of the filter is adjusted to produce an adjusted filter response. Once the filter response has been adjusted, the process may repeat at step 150 if the adjustment is based on an incremental adjustment process.

Figure 10:
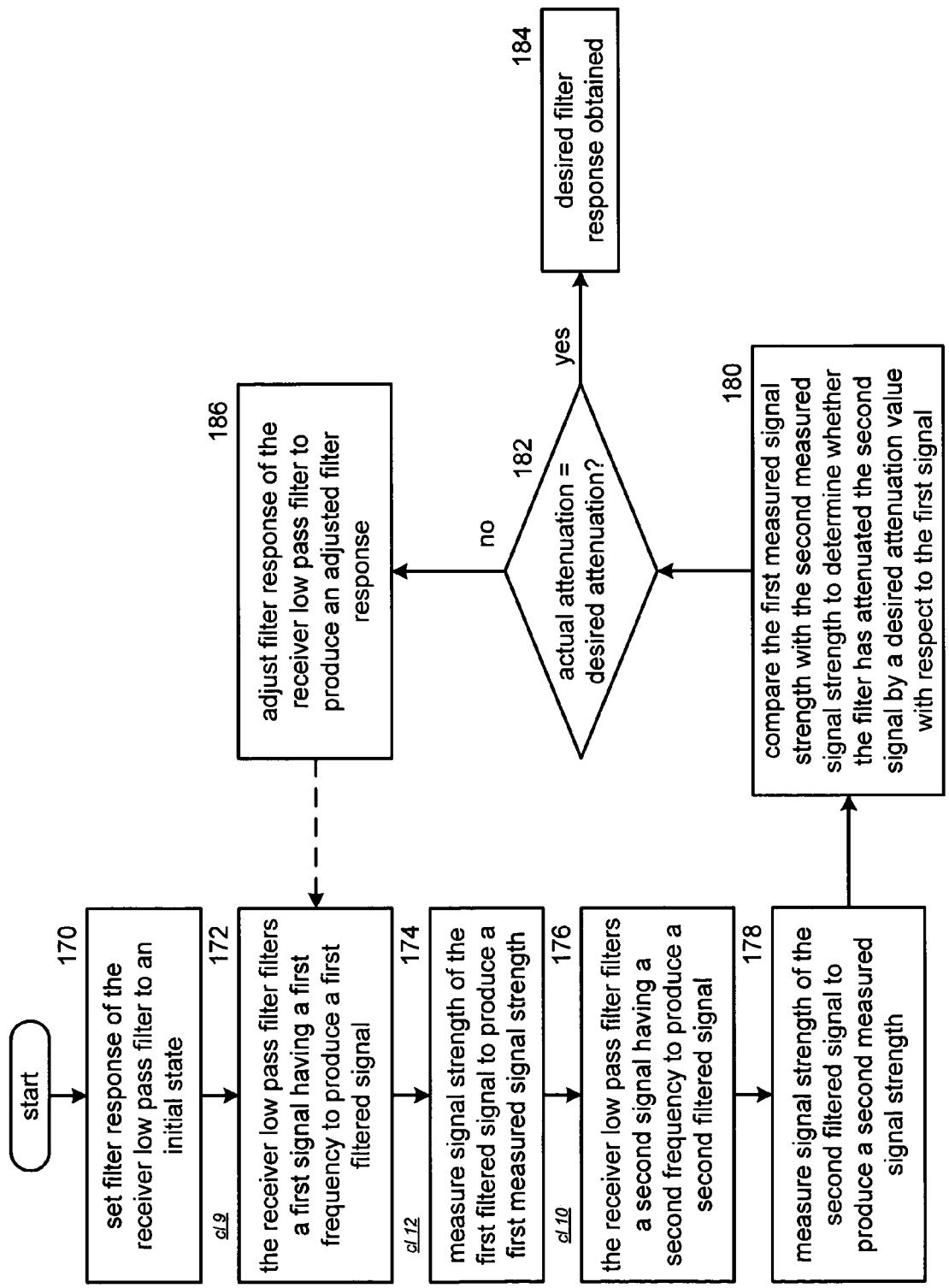
FIG. 10 is a logic diagram of a method for calibrating a low pass filter in accordance with the present invention.

FIG. 10 is a logic diagram of a method for calibrating a receiver low pass filter that begins at step 170 where the filter response of the receiver low pass filter is set to an initial state (e.g., to have the highest corner frequency possible or the lowest corner frequency possible based on adjustability of the low pass filter components). The processing continues at step 172 where the receiver low pass filter filters a first signal having a first frequency to produce a first filtered signal, wherein the first frequency is in a known pass region of the filter. The process continues at step 174 where the signal strength of the first filtered signal is measured to produce a first measured signal strength. The processing then continues at step 174 where the receiver low pass filter filters a second signal having a second frequency to produce a second filtered signal, wherein the second frequency is at a desired corner frequency of the filter. The processing continues at step 178 where the signal strength of the second filtered signal is measured to produce a second measured signal strength.

The process continues at step 180 where the first measured signal strength is compared with the second measured signal strength to determine whether the filter has attenuated the second signal by a desired attenuation value with respect to the first signal. If yes, the process proceeds to step 184 where the desired filter response is obtained. If not, the process proceeds to step 186 where the filter response of the receiver low pass filter is adjusted to produce an adjusted filter response. The process may then continue at step 172 with the new settings for the low pass filter.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a method and apparatus for accurate calibration of on chip filters. As one of average skill in the art will appreciate, the concepts of the present invention work for higher order filters than the ones presented in FIGS. 3-10. As one of average skill in the art will further appreciate, other embodiments may be derived from the teachings of the present invention without deviating from the scope of the claims.

What is claimed is:

1. A method for calibrating a filter, the method comprises:

filtering, by the filter, a first signal having a first frequency to produce a first filtered signal, wherein the first frequency is in a known pass region of the filter;

measuring signal strength of the first filtered signal to produce a first measured signal strength, filtering, by the filter, a second signal having a second frequency to produce a second filtered signal, wherein the second frequency is at a desired corner frequency of the filter;

measuring signal strength of the second filtered signal to produce a second measured signal strength;

comparing the first measured signal strength with the second measured signal strength to determine whether the filter has attenuated the second signal by a desired attenuation value with respect to the first signal; and when the filter has not attenuated the second signal by the desired attenuation value with respect to the first signal, adjusting filter response of the filter to produce an adjusted filter response.

2. The method of claim 1, wherein the adjusting the filter response further comprises:

incrementally adjusting a time-constant of the filter corresponding to the corner frequency to produce the adjusted filter response;

filtering, in accordance with the adjusted filter response, the second signal to produce a subsequent second filtered signal;

measuring signal strength of the subsequent second filtered signal to produce a subsequent second signal strength;

comparing the first measured signal strength with the subsequent second measured signal strength to determined whether the filtered has attenuated the second signal by the desired attenuation; and when the filter has not attenuated the second signal by a desired attenuation value with respect to the first signal, repeating the incrementally adjusting, the filtering, the measuring, and the comparing until the filter has attenuated the second signal by the desired attenuation value.

3. The method of claim 1, wherein the filter further comprises at least one of:

a low pass filter; and a high pass filter.

4. The method of claim 1, wherein the filter further comprises at least one of:

a band pass filter; and a stop band filter.

5. The method of claim 4 further comprises:

filtering, by the filter, a third signal having a third frequency to produce a third filtered signal, wherein the third frequency is at a second desired corner frequency of the filter;

measuring signal strength of the third filtered signal to produce a third measured signal strength;

comparing the first measured signal strength with the third measured signal strength to determine whether the filter has attenuated the third signal by a second desired attenuation value with respect to the first signal; and when the filter has not attenuated the third signal by the second desired attenuation value with respect to the first signal, adjusting filter response of the filter to produce an adjusted filter response.

6. The method of claim 1, wherein the measuring of the signal strength of the first and second signals further comprises at least one of:
- determining magnitude of the first and second signals to produce the first and second signal strengths, respectively;
- determining a square of the magnitude of the first and second signals to produce the first and second signal strengths, respectively;
- determining a power level of the first and second signals to produce the first and second signal strengths, respectively; and
- determining a received signal strength indication of the first and second signals to produce the first and second signal strengths, respectively.

7. The method of claim 1, wherein the adjusting the filter response further comprises:
- determining an actual attenuation value based on the first and second signal strengths;
- comparing the desired attenuation value to the actual attenuation value to determined an attenuation error; and
- adjusting the filter response based on the attenuation error.

8. A method for calibrating a receiver low pass filter, the method comprises:
- setting filter response of the receiver low pass filter to an initial state;
- filtering, by the receiver low pass filter, a first signal having a first frequency to produce a first filtered signal, wherein the first frequency is in a known pass region of the filter;
- measuring signal strength of the first filtered signal to produce a first measured signal strength,
- filtering, by the receiver low pass filter, a second signal having a second frequency to produce a second filtered signal, wherein the second frequency is at a desired corner frequency of the filter;
- measuring signal strength of the second filtered signal to produce a second measured signal strength;
- comparing the first measured signal strength with the second measured signal strength to determine whether the filter has attenuated the second signal by a desired attenuation value with respect to the first signal; and
- when the filter has not attenuated the second signal by the desired attenuation value with respect to the first signal, adjusting filter response of the receiver low pass filter to produce an adjusted filter response.

9. The method of claim 8, wherein the adjusting the receiver low pass filter response further comprises:
- incrementally adjusting a time-constant of the receiver low pass filter corresponding to the corner frequency to produce the adjusted filter response;
- filtering, in accordance with the adjusted filter response, the second signal to produce a subsequent second filtered signal;
- measuring signal strength of the subsequent second filtered signal to produce a subsequent second signal strength;
- comparing the first measured signal strength with the subsequent second measured signal strength to determine whether the receiver low pass filter has attenuated the second signal by the desired attenuation; and
- when the receiver low pass filter has not attenuated the second signal by a desired attenuation value with respect to the first signal, repeating the incrementally adjusting, the filtering, the measuring, and the comparing until the receiver low pass filter has attenuated the second signal by the desired attenuation value.

10. The method of claim 8, wherein the measuring of the signal strength of the first and second signals further comprises at least one of:
- determining in-phase component and quadrature component magnitudes of the first and second signals to produce the first and second signal strengths, respectively;
- determining a square of the magnitudes of the in-phase and quadrature components of the first and second signals to produce the first and second signal strengths, respectively;
- determining a power level of the in-phase and quadrature components of the first and second signals to produce the first and second signal strengths, respectively; and
- determining a received signal strength indication of the in-phase and quadrature components of the first and second signals to produce the first and second signal strengths, respectively.

11. The method of claim 8, wherein the adjusting the receiver low pass filter response further comprises:
- determining an actual attenuation value based on the first and second signal strengths;
- comparing the desired attenuation value to the actual attenuation value to determined an attenuation error; and
- adjusting the filter response based on the attenuation error.

12. A calibrating filter comprises:
- filtering circuit operable to substantially pass received signals having a frequency in a pass region and to attenuate received signals having a frequency outside the pass region; and
- calibration module operably coupled to the filtering circuit, wherein the calibration module:
  - measures signal strength of a first filtered signal to produce a first measured signal strength, wherein the filtering circuit produces the first filtered signal by filtering a signal having a first frequency, wherein the first frequency is within the pass region;
  - measures signal strength of a second filtered signal to produce a second measured signal strength, wherein the filtering circuit produces the second filtered signal by filtering a signal having a second frequency, wherein the second frequency is at a desired corner frequency of the filter;
  - compares the first measured signal strength with the second measured signal strength to determine whether the filtering circuit has attenuated the second signal by a desired attenuation value with respect to the first signal; and
  - when the filtering circuit has not attenuated the second signal by the desired attenuation value with respect to the first signal, adjusting filter response of the filtering circuit to produce an adjusted filter response.

13. The calibrating filter of claim 12, wherein the adjusting the filter response further comprises:
- incrementally adjusting a time-constant of the filter corresponding to the corner frequency to produce the adjusted filter response;
- filtering, in accordance with the adjusted filter response, the second signal to produce a subsequent second filtered signal;
- measuring signal strength of the subsequent second filtered signal to produce a subsequent second signal strength;

comparing the first measured signal strength with the subsequent second measured signal strength to determine whether the filtering circuit has attenuated the second signal by the desired attenuation; and when the filtering circuit has not attenuated the second signal by a desired attenuation value with respect to the first signal, repeating the incrementally adjusting, the filtering, the measuring, and the comparing until the filtering circuit has attenuated the second signal by the desired attenuation value.

14. The calibrating filter of claim 12, wherein the filtering circuit further comprises at least one of:

low pass filtering circuit; and high pass filtering circuit.

15. The calibrating filter of claim 12, wherein the filtering circuit further comprises at least one of:

band pass filtering circuit; and stop band filtering circuit.

16. The calibrating filter of claim 15, wherein the calibration module farther functions to:

measure signal strength of a third filtered signal to produce a third measured signal strength, wherein the filtering circuit filters a signal having a third frequency to produce the third filtered signal, wherein the third frequency is at a second desired corner frequency of the filtering circuit;

compare the first measured signal strength with the third measured signal strength to determine whether the filtering circuit has attenuated the third signal by a second desired attenuation value with respect to the first signal; and when the filtering circuit has not attenuated the third signal by the second desired attenuation value with respect to the first signal, adjust filter response of the filtering circuit to produce an adjusted filter response.

17. The calibrating filter of claim 12, wherein the measuring of the signal strength of the first and second signals farther comprises at least one of:

determining magnitude of the first and second signals to produce the first and second signal strengths, respectively;

determining a square of the magnitude of the first and second signals to produce the first and second signal strengths, respectively;

determining a power level of the first and second signals to produce the first and second signal strengths, respectively; and determining a received signal strength indication of the first and second signals to produce the first and second signal strengths, respectively.

18. The calibrating filter of claim 12, wherein the adjusting the filter response further comprises:

determining an actual attenuation value based on the first and second signal strengths;

comparing the desired attenuation value to the actual attenuation value to determined an attenuation error; and adjusting the filter response based on the attenuation error.

* * * * *

UNITED STATES PATENT AND TRADEMARK OFFICE
CERTIFICATE OF CORRECTION

PATENT NO. : 7,345,490 B2  Page 1 of 1
APPLICATION NO. : 11/120608
DATED : March 18, 2008
INVENTOR(S) : Brima B. Ibrahim et al.

It is certified that error appears in the above-identified patent and that said Letters Patent is hereby corrected as shown below:

Column 13, line 20, in Claim 16: replace "farther" with --further--.

Column 14, line 7, in Claim 17: replace "farther" with --further--.

Signed and Sealed this

Third Day of March, 2009

JOHN DOLL
*Acting Director of the United States Patent and Trademark Office*